(12) United States Patent
Park et al.

(10) Patent No.: US 8,890,132 B2
(45) Date of Patent: Nov. 18, 2014

(54) ORGANIC LIGHT EMITTING DISPLAY DEVICE AND METHOD OF MANUFACTURING THE SAME

(71) Applicant: Samsung Display Co., Ltd., Yongin (KR)

(72) Inventors: Jong-Hyun Park, Yongin (KR);
Seong-Kweon Heo, Yongin (KR);
Hye-Dong Kim, Yongin (KP)

(73) Assignee: Samsung Display Co., Ltd.,
Giheung-Gu, Yongin, Gyeonggi-Do (KR)

(*) Notice: Subject to any disclaimer, the term of this patent is extended or adjusted under 35 U.S.C. 154(b) by 0 days.

(21) Appl. No.: 13/798,564

(22) Filed: Mar. 13, 2013

(65) Prior Publication Data

US 2014/0077174 A1    Mar. 20, 2014

(30) Foreign Application Priority Data

Sep. 18, 2012    (KR) .......................... 10-2012-0103614

(51) Int. Cl.
*H01L 51/52*     (2006.01)
*H01L 51/56*     (2006.01)
*H01L 27/32*     (2006.01)

(52) U.S. Cl.
CPC .......... *H01L 51/5271* (2013.01); *H01L 27/326* (2013.01); *H01L 51/56* (2013.01); *H01L 2227/323* (2013.01)
USPC ............................................. 257/40; 438/34

(58) Field of Classification Search
USPC .................................. 257/59, 40; 438/34, 35
See application file for complete search history.

(56) References Cited

U.S. PATENT DOCUMENTS

| 2012/0132916 A1 | 5/2012 | Jung |
| 2012/0146033 A1 | 6/2012 | Lee et al. |
| 2013/0032802 A1* | 2/2013 | Kim et al. .................. 257/59 |
| 2013/0032803 A1 | 2/2013 | Moon et al. |

FOREIGN PATENT DOCUMENTS

| JP | 2005-268046 | 9/2005 |
| KR | 10-2012-0056505 | 6/2012 |
| KR | 10-2012-0066494 | 6/2012 |
| KR | 10-2013-0014860 | 2/2013 |
| KR | 10-2013-0015704 | 2/2013 |

* cited by examiner

*Primary Examiner* — Daniel Shook
(74) *Attorney, Agent, or Firm* — Robert E. Bushnell, Esq.

(57) ABSTRACT

An organic light emitting display device including: a substrate; an active layer formed on the substrate; a first insulation film disposed on the substrate to cover the active layer; a transistor including a gate electrode disposed at a location corresponding to the active layer with the first insulation film in between, and source and drain electrodes electrically connected to the active layer; a first electrode layer disposed on the substrate and electrically connected to any one of the source and drain electrodes of the transistor; a second electrode layer formed on the first electrode layer; an organic light emitting layer disposed between the first electrode layer and the second electrode layer; and a light reflecting unit covering a side and a part of top of the first electrode layer.

21 Claims, 5 Drawing Sheets

ORGANIC LIGHT EMITTING DISPLAY DEVICE AND METHOD OF MANUFACTURING THE SAME

CLAIM PRIORITY

This application makes reference to, incorporates the same herein, and claims all benefits accruing under 35 U.S.C. §119 from an application earlier filed in the Korean Intellectual Property Office on 18 Sep. 2012 and there duly assigned Serial No. 10-2012-0103614.

BACKGROUND OF THE INVENTION

1. Field of the Invention

The present invention generally relates to an organic light emitting display device and a method of manufacturing the same.

2. Description of the Related Art

Since an organic light emitting display device that is a self-emission type display device does not require a light source, the organic light emitting display device may be driven at a low voltage, light, and thin. Also, according to high-grade characteristics, such as a wide viewing angle, a high contrast, and a quick response speed, of the organic light emitting display device, the organic light emitting display device is receiving attention as a next generation display device.

The above information disclosed in this Related Art section is only for enhancement of understanding of the background of the invention and therefore it may contain information that does not form the prior art that is already known to a person of ordinary skill in the art.

SUMMARY OF THE INVENTION

The present invention provides an organic light emitting display device and a method of manufacturing the same, wherein manufacturing operations are simplified and light efficiency is increased.

According to an aspect of the present invention, there may be provided an organic light emitting display device including: a substrate; an active layer formed on the substrate; a first insulation film disposed on the substrate to cover the active layer; a transistor including a gate electrode disposed at a location corresponding to the active layer with the first insulation film in between, and source and drain electrodes electrically connected to the active layer; a first electrode layer disposed on the substrate and electrically connected to any one of the source and drain electrodes of the transistor; a second electrode layer formed on the first electrode layer; an organic light emitting layer disposed between the first electrode layer and the second electrode layer; and a light reflecting unit covering a side and a part of top of the first electrode layer.

The substrate may include a groove formed towards a thickness direction of the substrate, and a part of the light reflecting unit fills the groove.

The substrate may include a groove formed along an edge of a region corresponding to the first electrode layer, and a part of the light reflecting unit fills the groove.

The light reflecting unit may include: a first part contacting a side of the first electrode layer; and a second part contacting a part of top of the first electrode layer.

The second part may surround the organic light emitting layer.

A height of the first part may be substantially equal to a thickness of the first electrode layer, and a height of the second part may be larger than a thickness of the organic light emitting layer.

An inner width of the second part may be equal to or larger than a width of the organic light emitting layer.

The first electrode layer and the gate electrode may be disposed directly on the first insulation film.

The light reflecting unit may include a metal material.

The light reflecting unit and the gate electrode may include the same material.

The organic light emitting display device may be a bottom emission type.

The organic light emitting display device may further include a capacitor comprising a lower electrode formed on the same layer as the active layer, and an upper electrode formed on the same layer as the first electrode layer.

According to another aspect of the present invention, there may be provided an organic light emitting display device including: a substrate; a light transmissive first electrode layer disposed on the substrate; a reflective second electrode layer formed on the light transmissive first electrode layer to face the light transmissive first electrode layer; an organic light emitting layer disposed between the light transmissive first electrode layer and the reflective second electrode layer, and emitting light; a transistor including a gate electrode, a source electrode, and a drain electrode; and a light reflecting unit covering a side and a part of top of the light transmissive first electrode layer.

The substrate may include a groove formed in a thickness direction of the substrate, and a part of the light reflecting unit fills the groove.

The groove may have a closed-curve surrounding the light transmissive first electrode layer.

The light reflecting unit may include: a first part contacting and covering the side of the light transmissive first electrode layer; and a second part contacting and covering the part of top of the light transmissive first electrode layer.

An inner width of the second part may be smaller than a width of the light transmissive first electrode layer and substantially equal to or smaller than a width of the organic light emitting layer.

According to another aspect of the present invention, there may be provided a method of manufacturing an organic light emitting display device, the method including: preparing a substrate; performing a first mask process wherein a semiconductor layer may be formed on the substrate and then an active region may be formed by patterning the semiconductor layer; performing a second mask process wherein a first insulation film and a second conductive film are sequentially stacked and then a first electrode layer may be formed by patterning the first conductive film; performing a third mask process wherein a second conductive film may be stacked on the first insulation film and then a reflective pattern and a gate electrode, which cover the first electrode layer, are formed by patterning the second conductive film; doping a part of the active region by using the gate electrode as a mask; performing a fourth mask process wherein a second insulation film may be formed and then openings exposing a part of the reflective pattern and the doped part of the active region are formed; performing a fifth mask process wherein a source electrode and a drain electrode, which are electrically connected to the doped part of the active region, are formed by forming and then patterning a third conductive film, and a light reflecting unit covering a side and a part of top of the first electrode layer may be formed by patterning the part of the reflective pattern exposed through the openings formed during the performing of the fourth mask process; and performing a sixth mask process wherein a pixel region may be defined by stacking and the patterning a third insulation film.

The preparing of the substrate may include preparing a substrate including a groove extending in a thickness direction of the substrate along a region corresponding to the light reflecting unit.

The performing of the first mask process may further include forming a lower electrode of a capacitor by patterning the semiconductor layer, and the performing of the second mask process may further include forming an upper electrode of the capacitor by patterning the first conductive film.

The performing of the third mask process may include forming a reflective pattern larger than the first electrode layer so as to cover a part of the first electrode layer and some region of the first insulation film around the first electrode layer.

The performing of the fourth mask process may include forming a first opening exposing a part of the reflective pattern by patterning the second insulation film and simultaneously forming second and third openings exposing a part of the active region by patterning the first and second insulation films.

A size of the first opening may be smaller than a size of the first electrode.

The method may further include, after the performing of the sixth mask process, forming an organic light emitting layer on the first electrode layer, and a second electrode layer, wherein a height of the light reflecting unit covering the part of the top of the first electrode layer may be larger than a thickness of the organic light emitting layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

As the invention allows for various changes and numerous embodiments, particular embodiments will be illustrated in the drawings and described in detail in the written description. However, this is not intended to limit the present invention to particular modes of practice, and it will to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention. While such terms as "first," "second," etc., may be used to describe various components, such components must not be limited to the above terms. The above terms are used only to distinguish one component from another. The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added. As used herein, the term "and/or" includes any and all combinations of one or more of the associated listed items.

In the drawings, like reference numerals denote like elements, and the sizes and thicknesses of layers and regions are exaggerated for clarity. It will also be understood that when a portion, such as a layer, a film, a region, or a plate, is referred to as being "on" another portion, it can be directly on the other portion, or intervening portion may also be present.

Further, It will be understood that when an element or layer is referred to as being "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the invention. As used herein, the singular forms "a," "an" and "the" are intended to include the plural forms as well, unless the context clearly indicates otherwise. It will be further understood that the terms "comprises" and/ or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross sectional illustrations that are schematic illustrations of illustratively idealized example embodiments (and intermediate structures) of the inventive concept. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A flat panel display device, such as the organic light emitting display device, is manufactured on a substrate having a pattern including a thin film transistor (TFT thin film transistor), a capacitor, and wires connecting the TFT and the capacitor. Generally, in order to form the pattern having a minute structure on the substrate on which the flat panel display device is formed, the pattern is transferred on the substrate by using a mask having the pattern.

However, when a number of operations using the mask increases, manufacturing costs for preparing the mask are increased, manufacturing operations are complex since complex operations are performed to prepare the mask, and manufacturing time are increased. Thus, researches on an organic light emitting display device having a high quality, a low manufacturing time, and a low production cost are continuously conducted.

Figure 1:
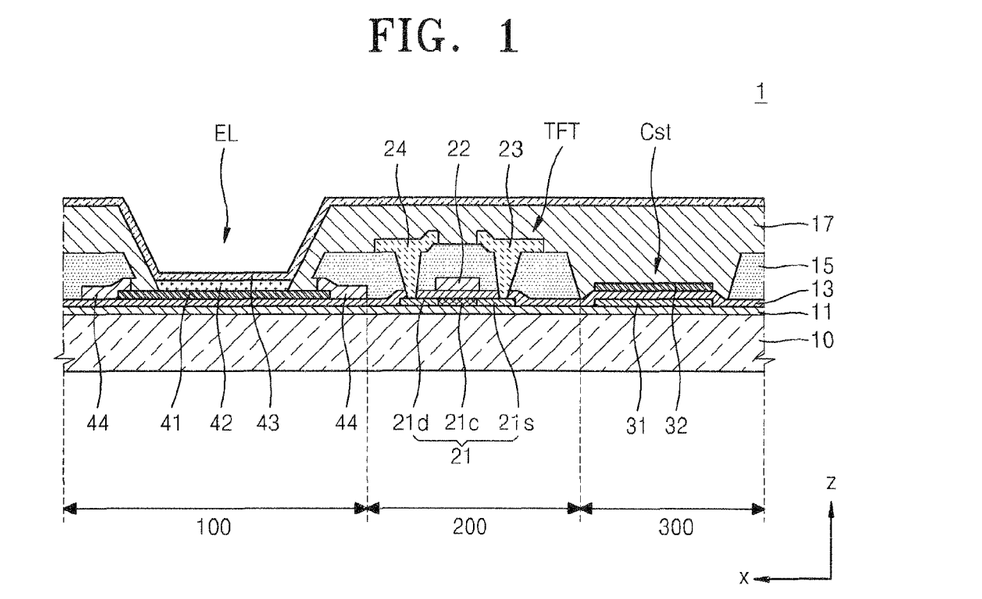
FIG. 1 is a cross-sectional view of an organic light emitting display device according to an embodiment of the present invention.

FIG. 1 is a cross-sectional view of an organic light emitting display device 1 according to an embodiment of the present invention.

Referring to FIG. 1, the organic light emitting display device 1 may include a pixel region 100 including an organic light emitting display EL formed on a substrate 10, a thin film transistor region 200 including a thin film transistor TFT, and a storage region 300 including a capacitor Cst.

The substrate 10 may be a light transmissive low temperature polycrystalline silicon (LTPS) substrate, a glass substrate, or a plastic substrate.

The thin film transistor TFT may be located as a driving device in the thin film transistor region 200. In FIG. 1, only the thin film transistor TFT for supplying a current to the organic light emitting display EL by being electrically connected to the organic light emitting display EL is shown, but alternatively, the organic light emitting display device 1 may further include a switching thin film transistor electrically connected to the capacitor Cst, etc.

The thin film transistor TFT may include an active layer 21, a gate electrode 22, a source electrode 23, and a drain electrode 24. A first insulation film 13 may be disposed between the gate electrode 22 and the active layer 21, as a gate insulation film to insulate the gate electrode 22 and the active layer 21 from each other. A source region $21s$ and a drain region $21d$, which are doped with high concentration impurities, are formed respectively at edges of the active layer 21 with a channel region $21a$ in therebetween, wherein source region $21s$ and the drain region $21d$ are respectively electrically connected to the source electrode 23 and the drain electrode 24. In FIG. 1, the thin film transistor TFT may be a top gate type, but alternatively, the thin film transistor TFT may be any type, such as a bottom gate type.

The capacitor Cst may be located in the storage region 300. The capacitor Cst charges a signal to be applied to the thin film transistor TFT even after the switching thin film transistor is turned off. The capacitor Cst includes a lower electrode 31, an upper electrode 32, and the first insulation film 13 disposed therebetween as a dielectric layer.

The lower electrode 31 may be formed on the same layer as the active layer 21. The lower electrode 31 may include a semiconductor material having improved electric conductivity by being doped with impurities. Meanwhile, the upper electrode 32 may be formed on the same material and of the same material as a first electrode layer 41 of the organic light emitting display EL.

The organic light emitting display EL may be located in the pixel region 100. The organic light emitting display EL includes the first electrode layer 41 electrically connected to one of the source electrode 23 and the drain electrode 24 of the thin film transistor TFT, a second electrode layer 43 facing the first electrode layer 41, and an organic light emitting layer 42 disposed between the first and second electrode layers 41 and 43.

The organic light emitting layer 42 may include a low or high molecular organic material. When the organic light emitting layer 42 includes a low molecular organic material, the organic light emitting layer 42 may further include a hole transport layer and a hole injection layer, which are formed toward the first electrode layer 41 with respect to the low molecular organic material, and an electron transport layer and an electron injection layer, which are formed toward the second electrode layer 43. Other various layers may be further included as occasion demands. Alternatively, when the organic light emitting layer 42 includes a high molecular organic material, the organic light emitting layer 42 may further include only a hole transport layer towards the first electrode layer 41.

The first electrode layer 41 may be a pixel electrode of the organic light emitting display EL and may be light transmissive, and the second electrode layer 43 may be a counter electrode of the organic light emitting display EL and may be light reflective. Accordingly, the organic light emitting display device 1 may be a bottom emission type emitting light towards a bottom surface of the substrate 10. The first electrode layer 41 may include at least one material selected from among transparent materials, such as indium tin oxide (ITO), indium zinc oxide (IZO), zinc oxide (ZnO), indium oxide (In2O3), indium gallium oxide (IGO), and aluminum zinc oxide (AZO). The second electrode layer 43 may be formed by thinly depositing a metal having a low work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), lithium fluoride (LiF)/Ca, LiF/Al, or a compound thereof.

The pixel region 100 further includes a light reflecting unit 44 gathering light generated by the organic light emitting layer 42 to a rear surface of the substrate 10. The light reflecting unit 44 may be formed on the same layer and of the same material as the gate electrode 22.

Figure 2:
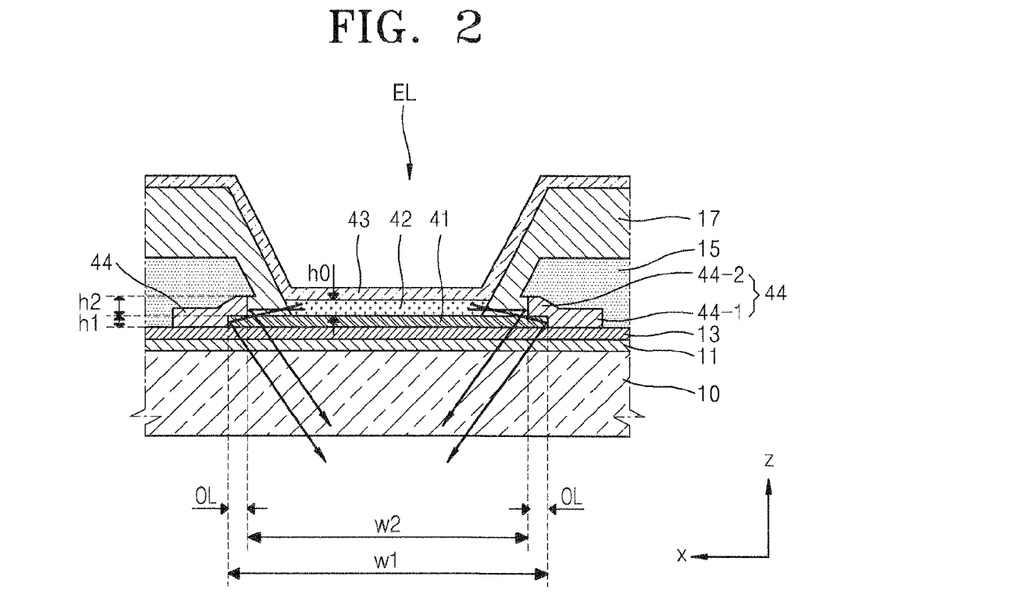
FIG. 2 is a cross-sectional view of a pixel region of the organic light emitting display device of FIG. 1.

The light reflecting unit 44 will now be described in detail with reference to FIGS. 2 and 3. FIG. 2 is a cross-sectional view of the pixel region 100 of the organic light emitting display device 1 of FIG. 1, and FIG. 3 is a top view of the pixel region 100 of FIG. 2.

Referring to FIG. 2, in the pixel region 100, an auxiliary layer 11 and the first insulation film 13 are sequentially formed on the substrate 10, and the first electrode layer 41 may be formed directly on the first insulation film 13. The light generated by the organic light emitting layer 42 may be reflected by the second electrode layer 43 and then emitted towards the rear surface of the substrate 10 through the first electrode layer 41.

The light reflecting unit 44 increases light efficiency of the organic light emitting display device 1 by gathering the light emitted all around from the organic light emitting layer 42 to the rear surface of the substrate 10. Light heading upward from among the light emitted from the organic light emitting layer 42 may be reflected by the second electrode layer 43 and head towards the first electrode layer 41, and light heading side may be reflected by the light reflecting unit 44 and emitted towards the first electrode layer 41. The light reflecting unit 44 may include a reflective metal material. The light reflecting unit 44 may be formed on the same layer and of the same metal material as the gate electrode 22 so as to reduce manufacturing costs while not increasing the number of manufacturing processes.

Figure 3:
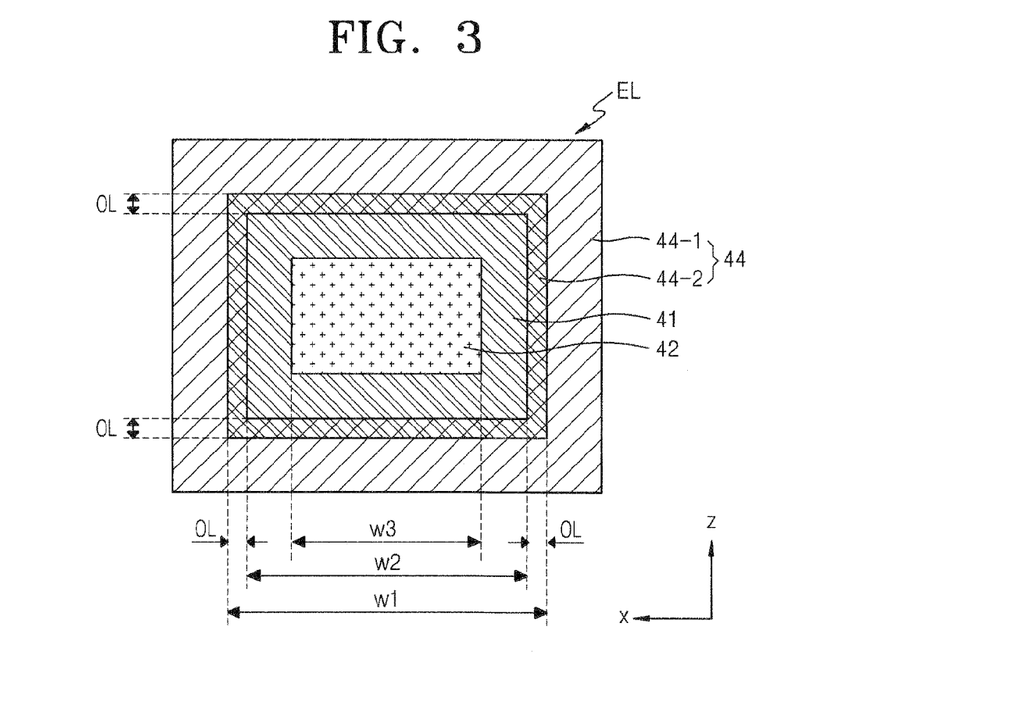
FIG. 3 is a top view of the pixel region of FIG. 2.

Referring to FIGS. 2 and 3, the light reflecting unit 44 may be formed to cover a side and a part of top of the first electrode layer 41. The light reflecting unit 44 may be formed to surround edges of the first electrode layer 41 in a closed-loop to effectively guide the light emitted from the organic light emitting layer 42 towards the rear surface.

The light reflecting unit 44 may include a first part 44-1 covering the side of the first electrode layer 41 and a second part 44-2 covering the part (for example, edge) of top of the first electrode layer 41. Since the light reflecting unit 44 is disposed to surround the edges of the first electrode layer 41, the light reflecting unit 44, for example the second part 44-2, and the first electrode layer 41 may form an overlap region OL. An inner width w2 of the second part 44-2 of the light reflecting unit 44 may be smaller than a width w1 of the first electrode layer 41.

Meanwhile, the organic light emitting layer 42 may be disposed on a location corresponding inside the second part 44-2 of the light reflecting unit 44. For example, the organic light emitting layer 42 may be surrounded by the second part 44-2 of the light reflecting unit 44. A width w3 of the organic light emitting layer 42 may be smaller than or equal to the inner width w2 of the second part 44-2.

The width w3 of the organic light emitting layer 42 may be smaller than the inner width w2 of the second part 44-2 in FIG. 2, but if the width w3 of the organic light emitting layer 42 is substantially equal to the inner width w2 of the second part 44-2, the light reflecting unit 44 may be disposed near the organic light emitting layer 42 as much as possible, and thus the light emitted from the side of the organic light emitting layer 42 may be directly reflected by the second part 44-2 of the light reflecting unit 44 thereby fundamentally preventing light leakage. Accordingly, light efficiency of the organic light emitting display device 1 may be further improved.

The first part 44-1 may directly contact the side of the first electrode layer 41, and a bottom surface of the first part 44-1 may directly contact the top of the first insulation film 13. A height h1 of the first part 44-1 may be substantially equal to a thickness of the first electrode layer 41.

The second part 44-2 may be integrally formed with the first part 44-1, and the bottom surface of the second part 44-2 may directly contact the top of the first electrode layer 41. A height h2 of the second part 44-2 may be equal to or larger than a thickness h0 of the organic light emitting layer 42 disposed inside the second part 44-2. When the height h2 of the second part 44-2 is equal to or larger than the thickness h0 of the organic light emitting layer 42, light emitted towards the side instead of the rear surface from among the light emitted from the organic light emitting layer 42 may head towards the rear surface after being reflected by the side of the second part 44-2 of the light reflecting unit 44 without leakage.

FIGS. 4A through 4F are cross-sectional views for describing a method of manufacturing the organic light emitting display device 1 of FIG. 1.

Figure 4A:
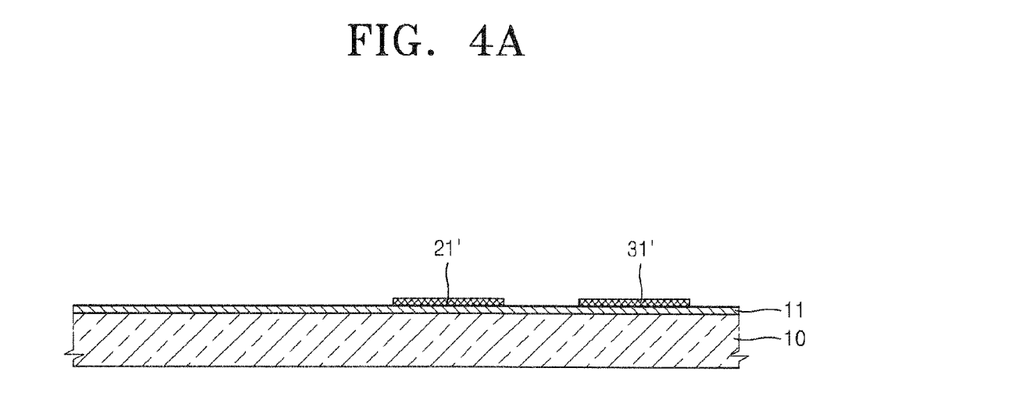
FIGS. 4A through 4F are cross-sectional views for describing a method of manufacturing the organic light emitting display device of FIG. 1.

First, referring to FIG. 4A, the auxiliary layer 11 may be formed on the substrate 10. Examples of the substrate 10 include a light transmissive substrate such as LTPS substrate, a glass substrate, and a plastic substrate, but are not limited thereto.

The auxiliary layer 11 prevents impurity ions from being diffused, prevents moisture or outside air from penetrating the substrate 10, and may include a barrier layer, a blocking layer, and/or a barrier layer to flatten the surface of the substrate 10. The auxiliary layer 11 may be formed of $SiO_2$ and/or $SiN_x$ via any one of various deposition methods, such as a plasma enhanced chemical vapor deposition (PECVD) method, an atmospheric pressure CVD (APCVD) method, and a low pressure CVD (LPCVD) method.

Next, a first mask process may be performed, wherein a semiconductor layer may be formed on the auxiliary layer 11, and then the semiconductor layer may be patterned to form an active region 21' in the thin film transistor region 200 and a lower electrode region 31' of the capacitor Cst in the storage region 300. An embodiment of the first mask process is as follows.

An amorphous silicon layer (not shown) may be first deposited on the auxiliary layer 11 and then may be crystallized to form a polycrystalline silicon layer (not shown). The amorphous silicon layer may be crystallized by using any one of various methods, such as a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

The polycrystalline silicon layer may be patterned to the active region 21' and the lower electrode region 31' via the first mask process using a first mask (not shown). The active region 21' and the lower electrode region 31' of FIG. 4A are respectively shown states before doping with impurities to form the active layer 21 of the thin film transistor TFT and the lower electrode 31 of the capacitor Cst.

Figure 4B:
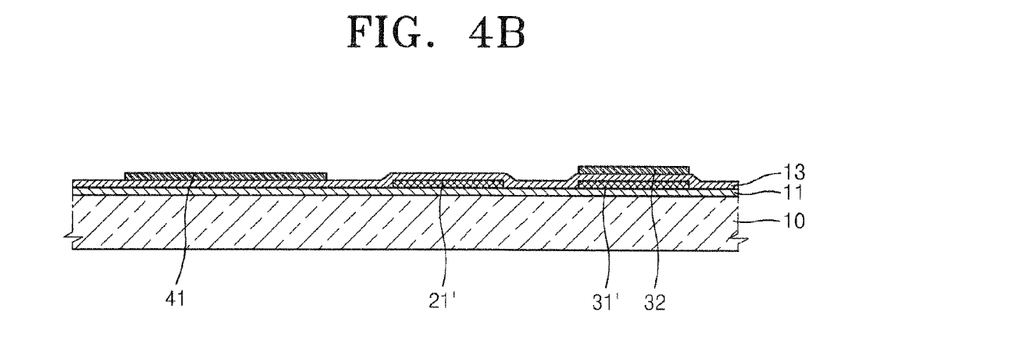

Referring to FIG. 4B, the first insulation film 13 and a first conductive film (not shown) are sequentially formed on a front surface of the substrate 10 on which the active region 21' and the lower electrode region 31' are formed.

The first insulation film 13 may be deposited on the front surface of the substrate 10 via a PECVD method, an APCVD method, or an LPCVD method, by using an inorganic insulation film formed of $SiN_x$ or $SiO_x$. The first insulation film 13 may be disposed between the active layer 21 and the gate electrode 22 to operate as a gate insulation film of the thin film transistor TFT, and may be disposed between the upper electrode 32 and the lower electrode 31 of the capacitor Cst described later to operate as a dielectric layer of the capacitor Cst.

The first conductive film may include at least one material selected from among transparent materials, such as ITO, IZO, ZnO, In2O3, IGO, and AZO.

Then, the first conductive film may be patterned to the first electrode layer 41 that may be a pixel electrode, and the upper electrode 32 of the capacitor Cst via the second mask process using a second mask (not shown).

Figure 4C:
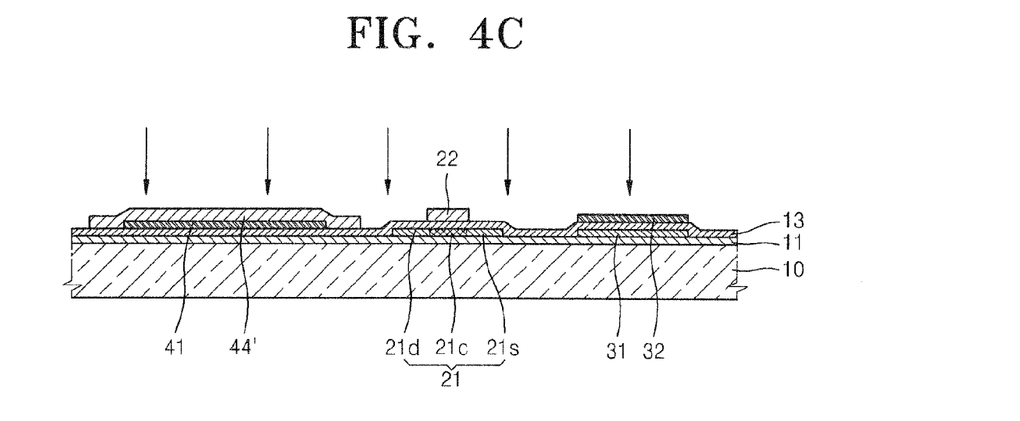

Referring to FIG. 4C, a reflective pattern 44' and the gate electrode 22 are formed.

First, a second conductive film (not shown) may be formed on the front surface of the substrate 10, and then the reflective pattern 44' and the gate electrode 22 are formed via a third mask process using a third mask (not shown). The second conductive film includes a metal material. The reflective pattern 44' may be formed (directly) on the first electrode layer 41 of the pixel region, and the gate electrode 22 may be formed on the active region 21' of the thin film transistor region.

Then, the active region 21' and the lower electrode region 31' are doped.

The gate electrode 22 may be formed to correspond to a center of the active region 21', and the active region 21' may be doped with n- or p-type impurities by using the gate electrode 22 as a self-align mask such that the active region 21' at sides of the gate electrode 22 respectively turn into the source region 21s and the drain region 21d. Accordingly, the source region 21s, the drain region 21d, and the active layer 21 including the channel region 21a disposed therebetween are formed.

When the active region 21' may be doped, the lower electrode region 31' included in the storage region 300 may be also doped to form the lower electrode 31 of the capacitor Cst. The entire lower electrode region 31' may be doped by using injected n- or p-type impurities. Since the active region 21' and the lower electrode region 31' are doped together, the active layer 21 and the lower electrode 31 may be doped with the same impurities.

Figure 4D:
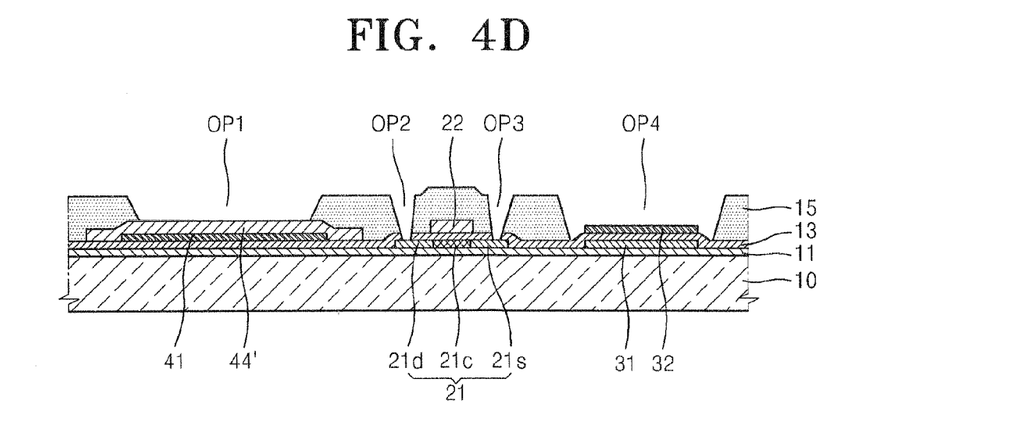

Referring to FIG. 4D, a second insulation film 15 may be deposited on the result product of FIG. 4C, and then first through fourth openings OP1, OP2, OP3, and OP4 are formed by patterning the second insulation film 15 by using a fourth mask (not shown).

The second insulation film 15 may be formed via a spin coating method by using at least one organic insulation material selected from the group consisting of polyimide, polyamide, acrylic resin, benzocyclobutene, and phenol resin. Alternatively, the second insulation film 15 may be formed of an inorganic insulation material like the first insulation film 13, or may be formed by alternatively stacking an organic insulation material and an inorganic insulation material. The second insulation film 15 may have a sufficient thickness to operate as an interlayer insulation film between the gate electrode 22 and the source and drain electrodes 23 and 24.

The first and fourth openings OP1 and OP4 are formed by patterning the second insulation film 15, and the second and third openings OP2 and OP3 are formed by patterning both of the first and second insulation films 13 and 15. A size of the first opening OP1 may be smaller than a size of the first electrode layer 41. The second and third openings OP2 and OP3 may be contact holes, and respectively expose parts of the source and drain regions 21s and 21d.

Figure 4E:
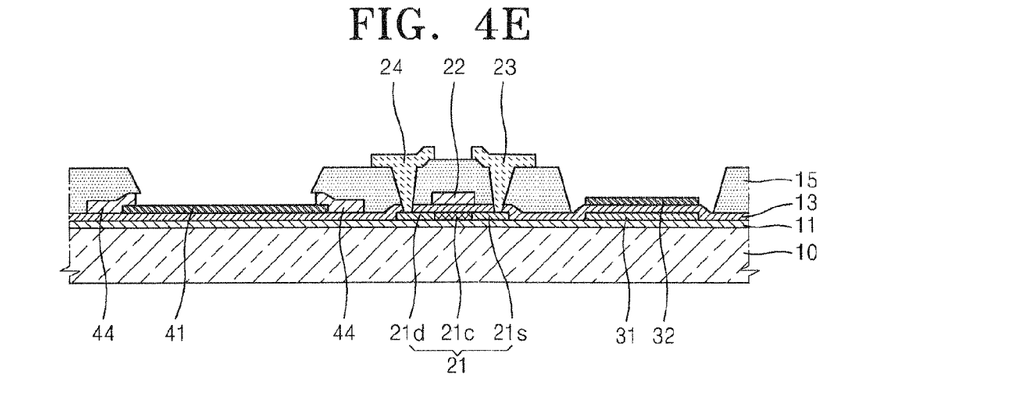

Referring to FIG. 4E, the source and drain electrodes 23 and 24 are formed, and the light reflecting unit 44 may be formed.

First, a third conductive film (not shown) may be stacked on the front surface of the substrate 10, and then the source electrode 23 and the drain electrode 24 are formed via a fifth mask process using a fifth mask (not shown).

According to the fifth mask process using the fifth mask, the third conductive film may be etched to form the source and drain electrodes 23 and 24, and at the same time, the reflective pattern 44' exposed through the first opening OP1 may be also etched to form the light reflecting unit 44.

As described above with reference to FIG. 4D, since the size of the first opening OP1 may be smaller than the size of the first electrode layer 41, the light reflecting unit 44 may be formed to cover the side and the part of top of the first electrode layer 41. For example as described above with reference to FIG. 3, the light reflecting unit 44 may be formed in the closed-loop to surround the edges of the first electrode layer 41 so as to effectively emit the light from the organic light emitting layer 42 towards the rear surface of the substrate 10.

Figure 4F:
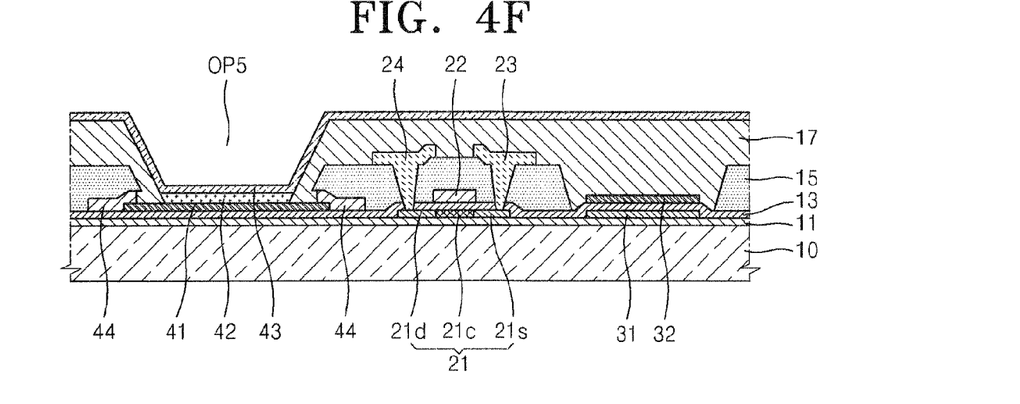

Referring to FIG. 4F, a third insulation film 17 may be formed on the substrate 10.

First, the third insulation film 17 may be formed throughout the result product of FIG. 4E. The third insulation film 17 may be formed via a spin coating method by using at least one organic insulation material selected from the group consisting of polyimide, polyamide, acrylic resin, benzocyclobutene, and phenol resin. Alternatively, the third insulation film 17 may be formed of an inorganic insulation material selected from among $SiO_2$, $SiN_x$, $Al_2O_3$, $CuOx$, $Tb_4O_7$, $Y_2O_3$, $Nb_2O_5$, and $Pr_2O_3$. Alternatively, the third insulation film 17 may have a multilayer structure in which an organic insulation material and an inorganic insulation material are alternately stacked on each other.

The third insulation film 17 may be formed to surround two sides of the capacitor Cst. Here, when the third insulation film 17 may be formed of an organic insulation material, the third insulation film 17 formed of the organic insulation material may prevent a short that may be generated between the lower electrode 31 and the upper electrode 32 of the capacitor Cst.

Then, the third insulation film 17 may define a pixel as a fifth opening OP5 may be formed to expose a center portion of the first electrode layer 41 by patterning the third insulation film 17 via a sixth mask process using a sixth mask (not shown). That is, the third insulation film 17 may function as a pixel definition layer. Here, the fifth opening OP5 may be smaller than the size of the first electrode layer 41.

Then, as shown in FIG. 1, the organic light emitting layer 42 and the second electrode layer 43 may be formed in the fifth opening OP5 exposing the first electrode layer 41. When the fifth opening OP5 may be smaller than the size of the first electrode layer 41, the organic light emitting layer 42 formed in the fifth opening OP5 may be surrounded by the light reflecting unit 44 (refer to the description of FIG. 2).

A stacked film may be removed during each of the first through sixth mask processes for forming the organic light emitting display device 1 by using dry etching or wet etching.

Figure 5:
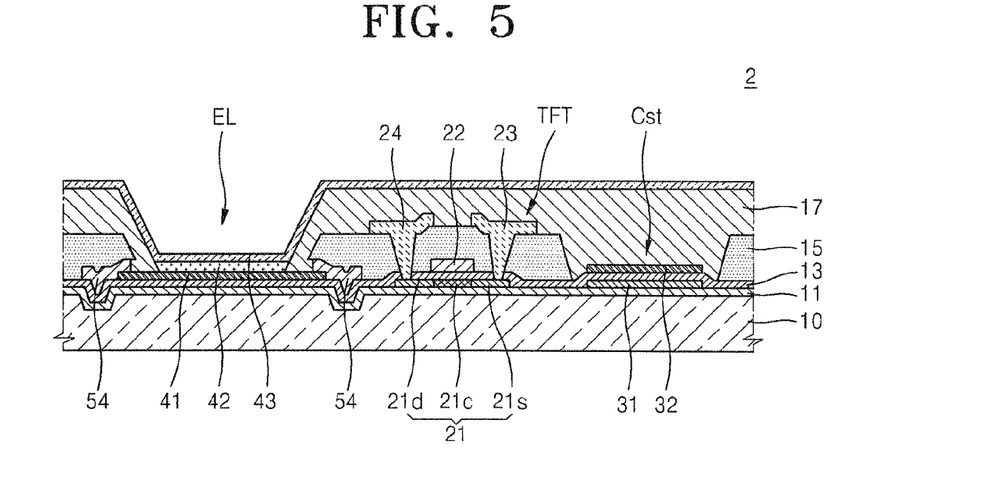
FIG. 5 is a cross-sectional view of an organic light emitting display device according to another embodiment of the present invention.
Figure 6:
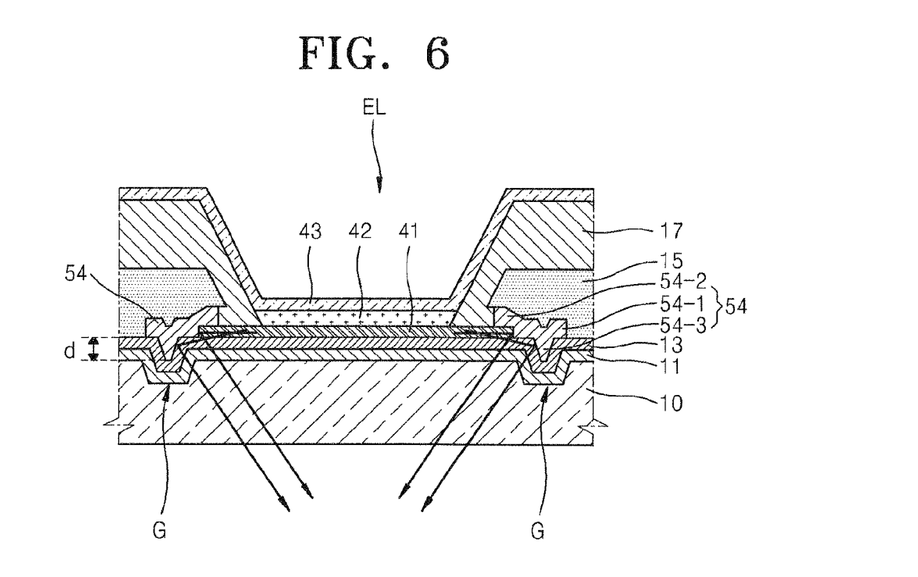
FIG. 6 is a cross-sectional view of a pixel region of the organic light emitting display device of FIG. 5.

FIG. 5 is a cross-sectional view of an organic light emitting display device 2 according to another embodiment of the present invention, and FIG. 6 is a cross-sectional view of a pixel region 100 of the organic light emitting display device 2 of FIG. 5.

Referring to FIG. 5, the organic light emitting display device 2 may include the pixel region 100 including an organic light emitting display EL formed on a top of a substrate 10, a thin film transistor region 200 including a thin film transistor TFT, and a storage region 300 including a capacitor Cst, wherein an overall structure may be identical to the organic light emitting display device 1 described above with reference to FIGS. 1 through 3. Thus, like reference numerals denote like elements, and differences will be mainly described.

Referring to FIGS. 5 and 6, the substrate 10 may further include a groove G sunken in a thickness direction. The groove G may be in a closed-curve surrounding a first electrode layer 41, and a part (third part 54-3) of a light reflecting unit 54 may fill the groove G.

The light reflecting unit 54 may include a first part 54-1 directly contacting and covering a side of the first electrode layer 41, a second part 54-2 directly contacting and covering a part of top of the first electrode layer 41, and the third part 54-3 extending downward from the first part 54-1.

Since the third part 54-3 may be disposed lower than the first electrode layer 41, the third part 54-3 may reflect and guide light that does not head towards a rear surface of the substrate 10 until light generated by an organic light emitting layer 42 may be completely emitted from the organic light emitting display device 2, i.e., until the light generated by the organic light emitting layer 42 may be emitted outside the substrate 10. In other words, the light reflecting unit 54 further includes the third part 54-3 to reduce interference of light that may be generated between adjacent pixels and prevent light leakage between adjacent pixels, thereby remarkably increasing light efficiency of the organic light emitting display device 2.

Since a depth d of the third part 54-3 may be smaller than a thickness of the substrate 10 and layers, such as an auxiliary layer 11 and a first insulation film 13, may be disposed between the substrate 10 and a light reflecting unit 54, the groove G formed in the substrate 10 may be deeper than the depth d of the third part 54-3. The groove G may be formed via any one of various processes, such as etching and laser scribing.

The organic light emitting display device 2 according to the current embodiment may be manufactured via substantially the same method described with reference to FIGS. 4A through 4F, except that the substrate 10 including the groove G may be used instead of the flat substrate 10 as shown in FIG. 4A. The groove G may extend in a thickness direction of the substrate 10 along a region corresponding to the light reflecting unit 54.

According to one or more embodiments of the present invention, an organic light emitting display device having improved light efficiency by using a light reflecting unit may be provided. Also, the organic light emitting display device may be manufactured by using a relatively simple method and low costs without an increase in the number of masks compared to a general organic light emitting display device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device, comprising:
a substrate;
an active layer formed on the substrate;
a first insulation film disposed on the substrate to cover the active layer;
a transistor comprising a gate electrode disposed at a location corresponding to the active layer with the first insulation film in between, and source and drain electrodes electrically connected to the active layer;
a first electrode layer disposed on the substrate and electrically connected to any one of the source and drain electrodes of the transistor;
a second electrode layer formed on the first electrode layer;
an organic light emitting layer disposed between the first electrode layer and the second electrode layer; and
a light reflecting unit covering a side and a part of top of the first electrode layer, the light reflecting unit includes a first part contacting a side of the first electrode layer and a second part contacting a part of top of the first electrode layer.

2. The organic light emitting display device of claim 1, wherein the substrate comprises a groove formed towards a thickness direction of the substrate, and a part of the light reflecting unit fills the groove.

3. The organic light emitting display device of claim 1, wherein the substrate comprises a groove formed along an edge of a region corresponding to the first electrode layer, and a part of the light reflecting unit fills the groove.

4. The organic light emitting display device of claim 1, wherein the second part surrounds the organic light emitting layer.

5. The organic light emitting display device of claim 1, wherein a height of the first part is substantially equal to a thickness of the first electrode layer, and a height of the second part is larger than a thickness of the organic light emitting layer.

6. The organic light emitting display device of claim 1, wherein an inner width of the second part is equal to or larger than a width of the organic light emitting layer.

7. The organic light emitting display device of claim 1, wherein the first electrode layer and the gate electrode are disposed directly on the first insulation film.

8. The organic light emitting display device of claim 1, wherein the light reflecting unit comprises a metal material.

9. The organic light emitting display device of claim 1, wherein the light reflecting unit and the gate electrode comprise the same material.

10. The organic light emitting display device of claim 1, being a bottom emission type.

11. The organic light emitting display device of claim 1, further comprising a capacitor comprising a lower electrode formed on the same layer as the active layer, and an upper electrode formed on the same layer as the first electrode layer.

12. An organic light emitting display device comprising:
a substrate;
a light transmissive first electrode layer disposed on the substrate;
a reflective second electrode layer formed on the light transmissive first electrode layer to face the light transmissive first electrode layer;
an organic light emitting layer disposed between the light transmissive first electrode layer and the reflective second electrode layer, and emitting light;
a transistor comprising a gate electrode, a source electrode, and a drain electrode; and
a light reflecting unit covering a side and a part of top of the light transmissive first electrode layer, the light reflecting unit includes a first part contacting and covering the side of the light transmissive first electrode layer and a second part contacting and covering the part of top of the light transmissive first electrode layer, an inner width of the second part is smaller than a width of the light transmissive first electrode layer and substantially equal to or smaller than a width of the organic light emitting layer.

13. The organic light emitting display device of claim 12, wherein the substrate comprises a groove formed in a thickness direction of the substrate, and a part of the light reflecting unit fills the groove.

14. The organic light emitting display device of claim 13, wherein the groove has a closed-curve surrounding the light transmissive first electrode layer.

15. A method of manufacturing an organic light emitting display device, the method comprising:
preparing a substrate;
performing a first mask process wherein a semiconductor layer is formed on the substrate and then an active region is formed by patterning the semiconductor layer;
performing a second mask process wherein a first insulation film and a second conductive film are sequentially stacked and then a first electrode layer is formed by patterning the first conductive film;
performing a third mask process wherein a second conductive film is stacked on the first insulation film and then a reflective pattern and a gate electrode, which cover the first electrode layer, are formed by patterning the second conductive film;
doping a part of the active region by using the gate electrode as a mask;
performing a fourth mask process wherein a second insulation film is formed and then openings exposing a part of the reflective pattern and the doped part of the active region are formed;
performing a fifth mask process wherein a source electrode and a drain electrode, which are electrically connected to the doped part of the active region, are formed by forming and then patterning a third conductive film, and a light reflecting unit covering a side and a part of top of the first electrode layer is formed by patterning the part of the reflective pattern exposed through the openings formed during the performing of the fourth mask process; and
performing a sixth mask process wherein a pixel region is defined by stacking and the patterning a third insulation film.

16. The method of claim 15, wherein the preparing of the substrate comprises preparing a substrate comprising a groove extending in a thickness direction of the substrate along a region corresponding to the light reflecting unit.

17. The method of claim 15, wherein the performing of the first mask process further comprises forming a lower electrode of a capacitor by patterning the semiconductor layer, and
the performing of the second mask process further comprises forming an upper electrode of the capacitor by patterning the first conductive film.

18. The method of claim 15, wherein the performing of the third mask process comprises forming a reflective pattern larger than the first electrode layer so as to cover a part of the first electrode layer and some region of the first insulation film around the first electrode layer.

19. The method of claim 15, wherein the performing of the fourth mask process comprises forming a first opening exposing a part of the reflective pattern by patterning the second insulation film and simultaneously forming second and third openings exposing a part of the active region by patterning the first and second insulation films.

20. The method of claim 19, wherein a size of the first opening is smaller than a size of the first electrode.

21. The method of claim 15, further comprising, after the performing of the sixth mask process, forming an organic light emitting layer on the first electrode layer, and a second electrode layer,
wherein a height of the light reflecting unit covering the part of the top of the first electrode layer is larger than a thickness of the organic light emitting layer.

* * * * *